United States Patent
Patel

(10) Patent No.: US 6,335,295 B1
(45) Date of Patent: Jan. 1, 2002

(54) FLAME-FREE WET OXIDATION

(75) Inventor: Rajiv Patel, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/231,265

(22) Filed: Jan. 15, 1999

(51) Int. Cl.[7] .................................................. H01L 21/02
(52) U.S. Cl. .......................... 438/773; 438/758; 438/769; 438/770; 438/775; 438/786; 438/787
(58) Field of Search .................................. 438/758, 769, 438/770, 773–775, 786, 787

(56) References Cited

U.S. PATENT DOCUMENTS 4,214,919 A * 7/1980 Young ............................. 148/1.5
4,268,538 A * 5/1981 Toole et al. ..................... 427/93

* cited by examiner

Primary Examiner—Charles Bowers
Assistant Examiner—Lisa Kilday

(57) ABSTRACT

Water for use in wet oxidation of semiconductor surfaces may be generated by reacting ultra pure hydrogen and ultra pure gaseous oxygen without a flame. Because no flame is used, contamination due to a flame impinging on components of a "torch" is not a problem. Flame-free generation of water is accomplished by reacting hydrogen and oxygen under conditions that do not result in ignition. This may be accomplished by provided a diluted hydrogen stream in which molecular hydrogen is mixed with a diluent such as a noble gas or nitrogen. This use of diluted hydrogen also reduces or eliminates the danger of explosion. This can simplify the apparatus design by eliminating the need for complicated interlocks, flame detectors, etc.

15 Claims, 4 Drawing Sheets

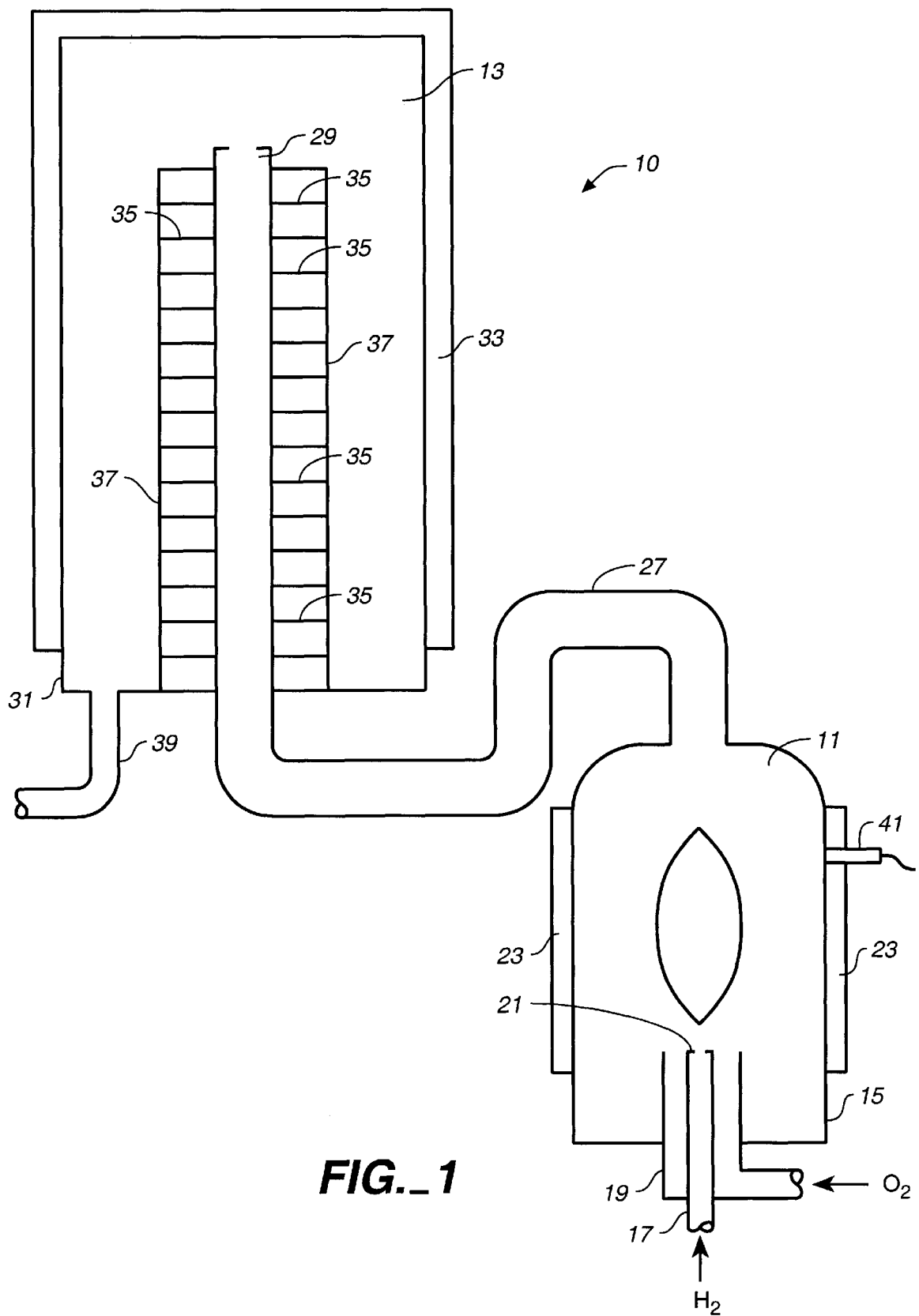
FIG._1

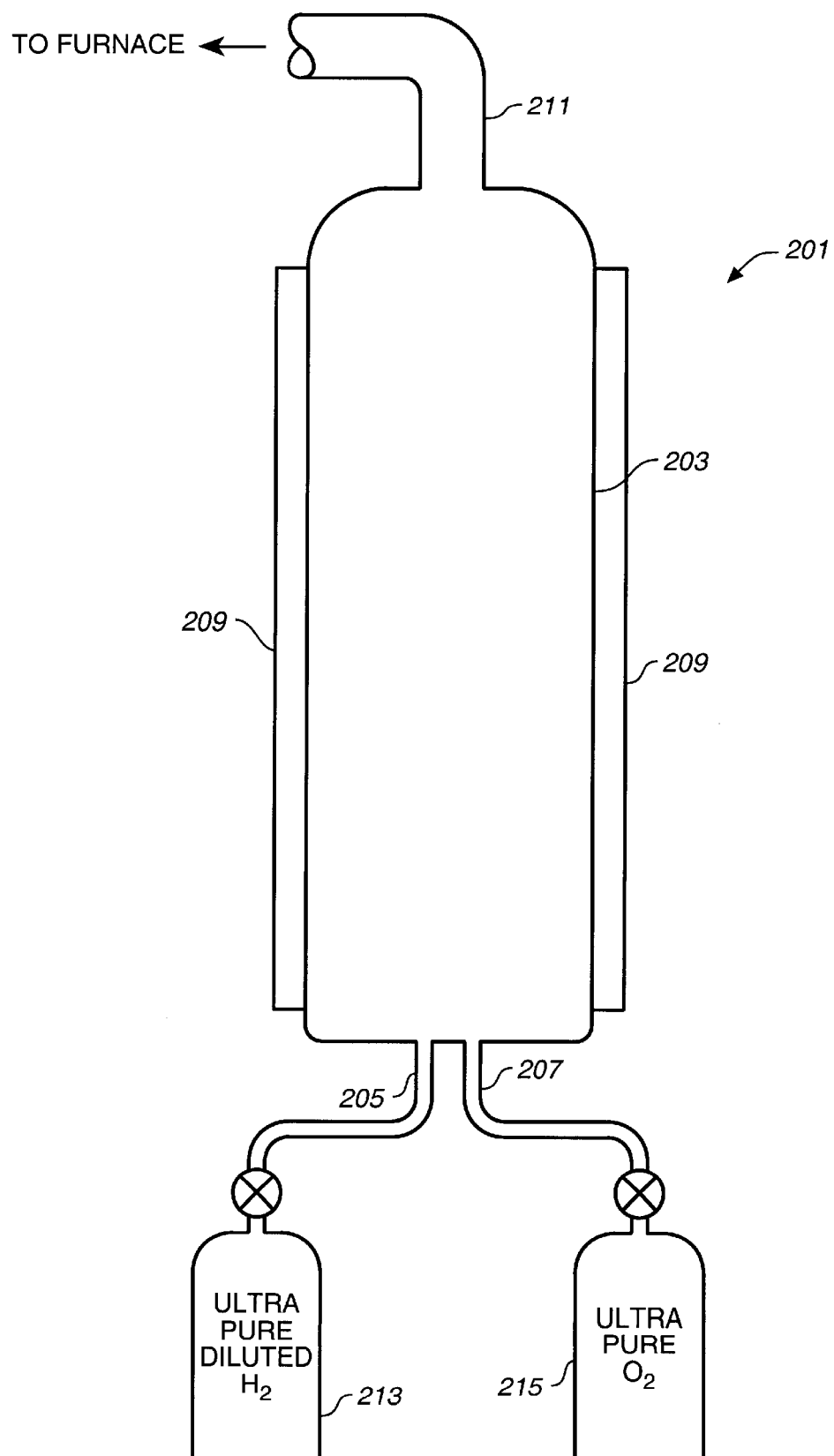
FIG._2A

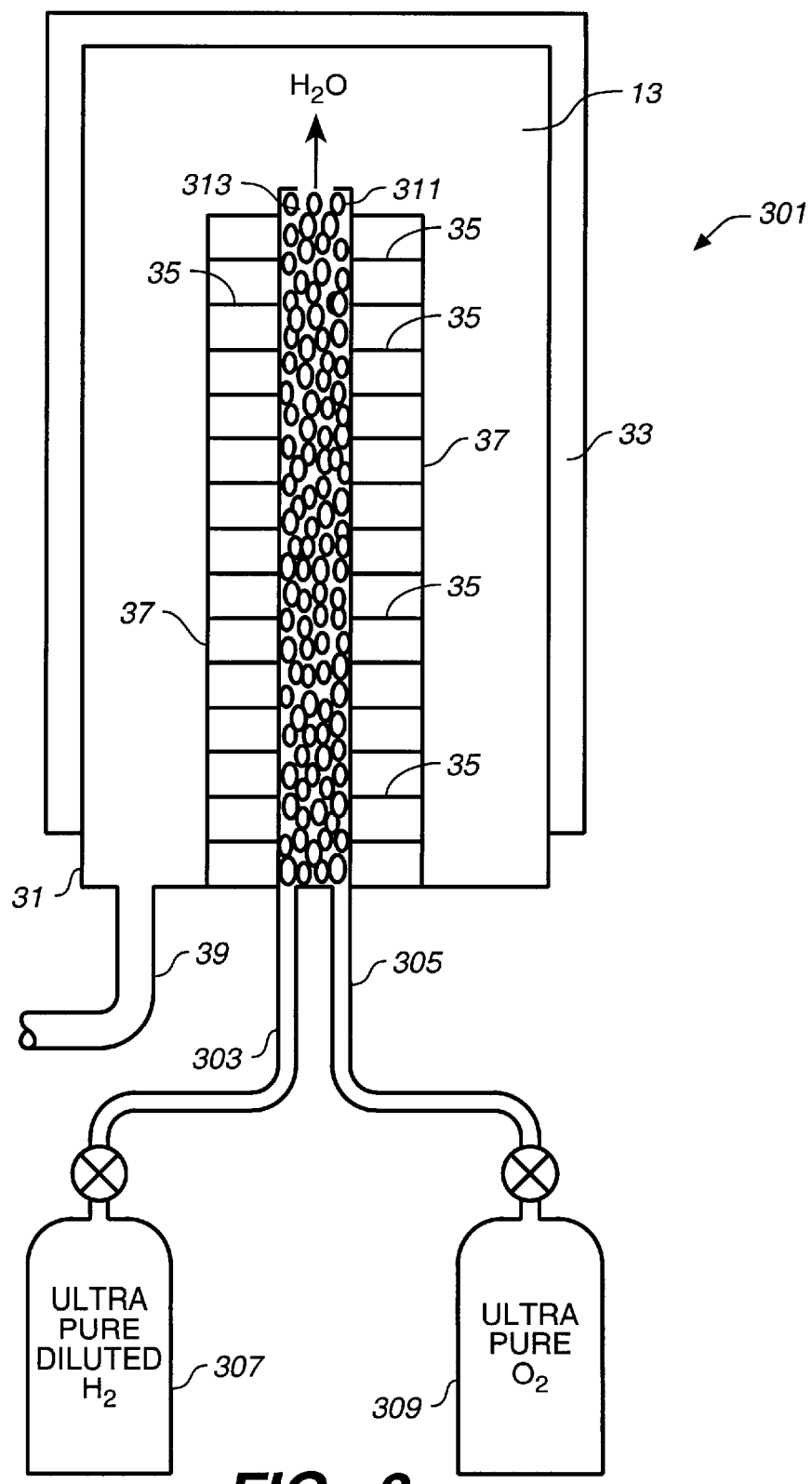
FIG._3

FLAME-FREE WET OXIDATION

BACKGROUND OF THE INVENTION

This invention relates to methods and apparatus for performing wet oxidation of semiconductor wafers. More particularly, the invention relates to safe methods and apparatus for forming high quality oxides via wet oxidation.

Wet and dry oxidation processes are currently employed by the semiconductor industry for the purpose of forming oxide layers such as gate oxides and isolation oxides on semiconductor surfaces. Dry oxidation processes typically employ molecular oxygen, nitrous oxide, nitric oxide, or some combination thereof to react with a semiconductor substrate surface and produce a layer of semiconductor oxide. The nitrogen containing a species may be employed when it is desirable to impart some nitrogen to the oxide, as is the case with hardened gate oxides, for example. Because it is relatively slow in comparison to wet oxidation processes, dry oxidation is typically limited to the formation of relatively thin oxide films.

Wet oxidation is the subject of the present invention. Wet oxidation involves reacting ultra pure water with the semiconductor surface to form oxide layers. Water vapor is typically reacted with a silicon substrate at a temperature in a neighborhood of 700 degrees Centigrade to form oxide layers between about 50 and 6000 angstroms in thickness. The ultra pure water is typically produced by a "torch" which is a reactor where ultra pure gaseous hydrogen is reacted with ultra pure gaseous oxygen to produce the water.

FIG. 1 presents a cross-sectional diagram of a wet oxidation system 10. The system 10 includes a "torch" II and a "furnace" 13 (terms used in the industry). As mentioned, hydrogen and oxygen react in the torch to form water. The water from torch 11 is piped to furnace 13 where it reacts with the silicon on multiple wafers to form silicon oxide layers.

Torch 11 contains a torch chamber wall 15, which is typically made from quartz. Chamber wall 15 may assume a generally "jug-shaped" configuration having a diameter of roughly 2"–12" and a height of roughly 12"–20". Generally, the torch is substantially smaller than the furnace. Note that torch 11 and furnace 13 are not drawn to scale in FIG. 1.

Ultra pure hydrogen and oxygen are introduced to the interior of torch 11 through an annular arrangement of quartz pipes. A hydrogen inlet 17 is provided through the bottom of torch chamber wall 15. A quartz inlet is defined by an annular pipe 19 which circumferentially surrounds hydrogen inlet pipe 17. The flow of hydrogen through inlet 17 is controlled by the size of an orifice 21 which may be a constriction at the end of quartz inlet pipe 17.

Torch 11 also includes a heater 23 which jackets a portion quartz vessel 15. Heater 23 may in one embodiment be a simple coil heater. It provides the energy necessary to ignite a hydrogen-oxygen flame 25 within the interior of torch 11. In many designs, the interior of torch 11 is maintained at a temperature of about 540 to 700 degrees Centigrade. At atmospheric pressure, a temperature of about 540 degrees Centigrade is required for ignition. The hydrogen-oxygen reaction is highly exothermic, producing a flame temperature in the neighborhood of 5000 degrees Centigrade. The water produced by the reaction of hydrogen and oxygen in flame 25 is directed to the bottom of furnace 13 through a pipe 27. There, it passes up through an injection tube 29 which is typically a hollow quartz tube oriented vertically in the center of the furnace.

Furnace 13 also includes a container wall 31 which may be made from quartz. It is generally cylindrically shaped and has a diameter of roughly 10" and a height of roughly 45". Wall 31 is jacketed by a very precise heater 33 which supplies sufficient energy to drive the oxidation reaction. To careful control the temperature within furnace 13, multiple thermocouples may provided in close proximity to wafers 35. Other thermocouples are provided in heater 33. Typically, the furnace interior is maintained at a temperature of about 700 or more degrees Centigrade. Water from water injection column 29 disperses throughout the interior of furnace 13 and contacts wafers 35 supported on a quartz boat 37. Quartz boat 37 is a ladder arrangement of horizontal quartz wafer support structures cut in or held in place by three or more vertical rails. In a typical design, quartz boat 37 may hold between 100 and 200 wafers. The water reacts with exposed silicon on wafers 35 to produce silicon oxide layers. An exhaust port 39 draws excess water together with any gaseous carriers and reaction products out of furnace 13.

This design has certain shortcomings. Most of these shortcomings derive from the fact that a hydrogen-oxygen flame is produced. It is critically important that the position of this flame be carefully controlled so that it does not contact the quartz torch vessel wall 15 or inlet pipes 17 or 19. Thus, the torch reactor must generally assume the jug-shape or some other shape which is unlikely to contact flame 25. In addition, the size of orifice 21 must be carefully controlled so that the hydrogen flow rate is sufficiently high to prevent the flame from contacting quartz inlet pipes 17 or 19. Should the flame contact any of the quartz components described herein, the quartz my devitrify and vaporize. This introduces particulates and other contaminants to the ultra pure water source, thereby precluding generation of a high quality oxide.

Still further, many precautions must be taken to ensure that hydrogen explosions do not occur. Typical safety mechanisms include interlocks to ensure that hydrogen does not flow without oxygen also flowing into torch 11. Further, additional interlocks are provided to ensure that the ratio of hydrogen to oxygen always remains below 2:1 by volume. Typically, the hydrogen to oxygen ratio is about 1.9 to 1 by volume. Still further, the torch often includes a flame detector such as a flame detector 41 shown in FIG. 1. Such a flame detector ensures that the hydrogen and oxygen are actually reacting. If there is no flame, an explosive mixture may be forming within the torch, within the furnace, or elsewhere.

In view of the above shortcomings, an improved wet oxidation system is necessary.

SUMMARY OF THE INVENTION

The present invention provides methods and apparatus for performing wet oxidation. Wet oxidation performed in accordance with this invention does not employ a flame. Therefore, contamination due to the flame impinging on quartz components of a torch is not a problem. Flame-free generation of water is accomplished by reacting hydrogen and oxygen under conditions that do not result in ignition. In a preferred embodiment, this is accomplished by providing a diluted hydrogen stream in which molecular hydrogen is mixed with a diluent such as a noble gas or nitrogen. This use of diluted hydrogen also reduces or eliminates the danger of explosion. This can greatly simplify the apparatus design by eliminating the need for complicated interlocks, flame detectors, etc.

One aspect of the invention provides a method of forming an oxygen containing layer on a semiconductor surface. The method may be characterized as including the following sequence: (a) forming water vapor by reacting gaseous hydrogen and gaseous oxygen without generating a flame; and (b) contacting the water vapor with the semiconductor surface under conditions which form the oxygen containing layer on the semiconductor surface. The oxide may be a silicon oxide layer or a nitrogen containing silicon oxide layer, for example. The water vapor should be sufficiently pure to meet the requirements of the semiconductor device fabrication industry. Generally, this means that the gaseous hydrogen and gaseous oxygen each will have a purity of at least about 99.999% by volume.

One technique for ensuring that the water vapor is formed without generating a flame involves providing the gaseous hydrogen as a mixture of molecular hydrogen and an inert diluent. Preferably, the molecular hydrogen is present in the mixture at a concentration of at most about 10% by volume. Preferably, the diluent is molecular nitrogen or a noble gas such as argon.

Another technique for ensuring that the water vapor is formed without generating a flame involves using a hydrogen-oxygen mixture having hydrogen far in excess of the stoichiometric 2:1 molar ratio. This technique involves forming a reaction mixture of gaseous hydrogen and gaseous oxygen in a ratio of molecular hydrogen to molecular oxygen that is at least about 4:6 by volume. Any excess hydrogen present after the reaction to form water vapor is removed by flashing it off or by other suitable technique.

If the water vapor is formed in a reactor separate from the furnace, it must be transported from the reactor where it is formed to a second reactor (e.g., the furnace) where it contacts the semiconductor substrate. Alternatively, the water vapor may be formed and reacted with the semiconductor surface in a single reactor. In some embodiments, the reactor includes an injection column packed with a heated packing material over which the reactant hydrogen and oxygen gases pass. The heated packing material provides the activation energy for the flameless reaction of hydrogen and oxygen.

Another aspect of the invention provides apparatus for forming the oxygen containing layer on a semiconductor surface. The apparatus may be characterized as including at least the following features: (a) a source of flowing gaseous oxygen; (b) a source of flowing diluted gaseous hydrogen comprising molecular hydrogen at a concentration of at most about 10% by volume in an inert diluent; (c) a reactor having one or more inlets allowing the flowing gaseous oxygen and the flowing gaseous hydrogen to enter the reactor; (d) a heat source which provides heat to the reactor, thereby activating a reaction between hydrogen and oxygen to produce water vapor; and (e) a wafer support which holds a semiconductor wafer in contact with the water vapor to allow formation of the oxygen containing layer.

If the wafer support resides in a separate system, the apparatus usually includes a conduit for transporting the water vapor formed in the reactor to the furnace. Alternatively, the wafer support resides in the reactor where the water vapor is formed. The apparatus may also include an injection column disposed within the reactor and packed with a packing material, as mentioned. In this design, the one more inlets are arranged with respect to the injection column such that the flowing gaseous hydrogen and the flowing gaseous oxygen are passed to the injection column where they react to form the water vapor.

These and other features and advantages of the present invention will be described in further detail below in conjunction with the appended drawings.

BRIEF DESCRIPTION OF THE DRAWINGS

FIG. 1 is an illustration of a wet oxidation apparatus including a torch for generating water and a furnace for reacting that water with semiconductor wafers to produce oxide films.

FIG. 2A is an illustration of a streamlined torch for flameless generation of water in accordance with one embodiment of this invention.

FIG. 3 is an illustration of a furnace in which water is both formed and reacted with semiconductor wafers to generate oxide layers in accordance with another embodiment of the present invention.

DETAILED DESCRIPTION OF THE PREFERRED EMBODIMENTS

Figure 2B:
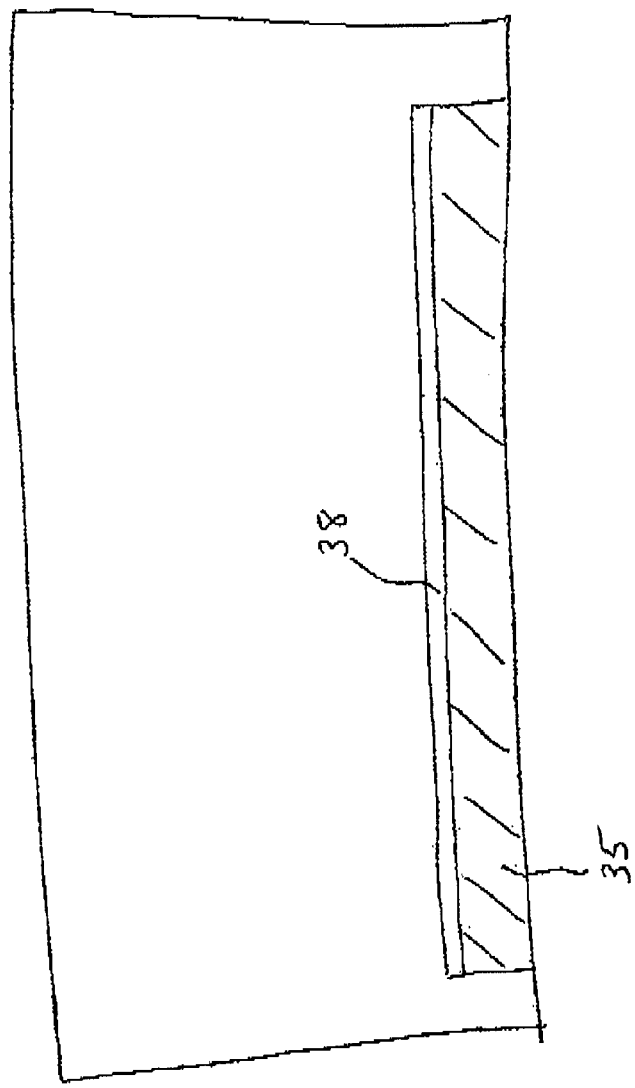
FIG. 2B is an illustration of a silicon oxide layer in accordance with one embodiment of this invention.

The present invention provides methods and apparatus for producing water vapor without the need for a flame. The water vapor so produced is provided to a semiconductor wafer or other substrate where it reacts to form an oxygen containing layer. Typically, the oxygen containing layer is a semiconductor oxide such as a silicon oxide. Depending upon the reaction conditions and reactant compositions, the oxygen containing layer may also include other elements such as nitrogen. Nitrogen may be a desirable component when a hardened gate oxide is formed, for example.

One technique for producing a flameless reaction between hydrogen and oxygen involves using a reaction mixture which is not explosive (or flammable) under the conditions of operation. At many temperature/pressure combinations, a hydrogen source gas of not more than about 10% by volume molecular hydrogen in an inert diluent will not burn in molecular oxygen. For some applications, the concentration of molecular hydrogen in the hydrogen source gas should not be greater than about 5% by volume. In some cases, it may be desirable to go to hydrogen concentrations as low as about 0.5% or even lower in diluent. This will produce water vapor of quite low partial pressure which is suitable for controlled growth of very thin oxides.

In the hydrogen-oxygen mixture produced by mixing the diluted hydrogen stream with an oxygen stream, the oxygen may be present at about the half the molar quantity as the hydrogen to provide a 2:1 hydrogen to oxygen molar ratio. In a preferred embodiment, a slight excess of hydrogen is employed so that the molar ratio is slightly greater than 2:1.

In an alternative embodiment, a flameless hydrogen/oxygen mixture has a ratio of hydrogen to oxygen of at least about 4:6 by volume (regardless of diluent present). Such mixtures will not burn at many temperature/pressures of commercial importance. At these high ratios of hydrogen to oxygen, care must be taken to ensure that the concentration of hydrogen does not drop significantly below this ratio to a point where it is explosive. Also, any unreacted hydrogen must be properly disposed of; as by flashing off exhaust gas from the reactor.

In the case where diluted hydrogen is employed, preferred diluents for use with hydrogen include any gas that will not react with any of the system components including the semiconductor substrate, gaseous hydrogen, gaseous oxygen, or the reactor components themselves. Examples include the noble gases and nitrogen. When very pure oxide films are desired, the noble gases are preferred because they are less likely than nitrogen to react with any components. A particularly preferred noble gas is argon. Whatever inert diluent gas is chosen, it should be ultra pure to meet the purity requirements of water for the particular application at hand. Generally, this means that the diluent should have a purity of at least 99.995% by volume (more preferably at least about 99.9997% percent by volume). Similarly, the molecular hydrogen and molecular oxygen source gases employed as gaseous reactants should be ultra pure; both should be at least about 99.999% by volume pure. More preferably, the molecular hydrogen and oxygen source gases should be at least about 99.9997% by volume. It should be understood that the invention is not limited to these purity criteria. For applications where relatively low purity water may be employed, the gaseous reactants and diluents need not be so pure as suggested here.

When one of the above mentioned diluents is used in the flowing gaseous hydrogen stream, its concentration should be at least about 90% and more preferably at least about 92% by volume. It should be understood, however, that the invention is not limited to binary mixtures of molecular hydrogen and the inert diluent. In some situations, it may be desirable to include a useable quantity of a third component such as oxygen, a getter material (e.g., hydrogen chloride), and/or an impurity to be introduced to the oxide layer (e.g., nitrogen from nitric or nitrous oxide).

In one example using the above concentrations of diluted hydrogen or ratios of hydrogen to oxygen, the reactor containing these compositions may be operated at pressures of between about 800 and 1 Torr and temperatures of between about 700 and 1,250 degrees Centigrade. More preferably, the reactor is operated at pressures of between about 200 and 800 Torr and temperatures of between about 700 and 1,000 degrees Centigrade. In one specific embodiment, the reaction conditions includes atmospheric pressure and about 700 degrees Centigrade temperature.

In conventional torches, the ratio of hydrogen to oxygen is maintained below 2:1. This ensures that there will not be excess hydrogen that goes unreacted. Because of the difficulty in setting the ratio stoichiometric 2:1, if a system was designed to operate at that ratio, some times there would be small excesses of hydrogen. Such excesses over the stoichiometric ratio will go through the torch without reacting. This represents a potential explosion hazard. Thus, wet oxidation apparatus is designed to work at ratios below the 2:1 stoichiometric ratio of hydrogen to oxygen. Because the present invention employs dilute non-flammable hydrogen, the apparatus can be designed to operate at exactly the 2:1 stoichiometric ratio. If there is a small excess of hydrogen, it does not pose a hazard.

FIG. 2A provides an example of a reaction chamber that can be used in lieu of the torch shown in FIG. 1. As shown in FIG. 2A, a reactor 201 includes a housing 203 which may be cylindrical in shape, for example. Other suitable shapes such as rectangles, squares, other polygons, and even the jug shape shown in the torch of FIG. 1 may be employed. Preferably, though not necessarily, reactor housing 203 is made of quartz. Other suitable materials for housing 203 include chemical vapor deposited silicon carbide on glass or quartz, polysilicon, tantalum, and stainless steel (assuming that no hydrogen chloride is used in the reaction mixture. It may also be made from Generally, the size of reactor 201 is comparable to that of a conventional torch. For example, it may have a height of between about 10 inches and about 50 inches and a principal cross-sectional dimension of between about 10 mm and about 12 inches.

Reactor 201 includes a flowing gaseous hydrogen inlet 205 and a flowing gaseous oxygen inlet 207. These may be provided as concentric inlets as shown in FIG. 1 or they may be nonconcentric, as it is no longer necessary to precisely control the position of a flame which could possibly impinge on the torch components. Inlets 205 and 207 provide the gaseous reactants to reactor 201 from a source of gaseous hydrogen 213 (and optionally with Ar or $N_2$) and a source of gaseous oxygen 215. The gaseous hydrogen should be ultra pure but diluted to the proper level with an ultra pure inert diluent as described above. The gaseous oxygen should preferably be ultra pure molecular oxygen. The gaseous reactants flow into reactor 201 where they react without forming a flame when heated to an appropriate temperature. That temperature is preferable between about 580 and 700 degrees Centigrade. The heat required to provide the activation energy necessary to promote the flameless reaction of hydrogen and oxygen may be provided by a heat source 209 such as a plurality of heating coils. Heat source 209 should be controlled to provide a temperature within the ranges specified above to ensure reaction between the hydrogen and oxygen.

The water vapor produced by the flameless reaction in reactor 201 exits through an outlet 211 and through an appropriate conduit to a furnace such as a conventional furnace as described with reference to FIG. 1. In the furnace, the water vapor produced in reactor 201 reacts with exposed reactive surfaces (e.g., semiconductor surfaces) to produce high quality oxide layers as depicted in FIG. 2B. FIG. 2B is a more detailed cross-sectional block diagram of a quartz boat 37 and a silicon.

In a second embodiment, apparatus suitable for implementing the present invention is shown in FIG. 3. The apparatus shown in FIG. 3 is a variant of the furnace 13 shown in FIG. 1. In this case, the furnace has been modified to include a reaction zone where gaseous hydrogen and oxygen streams can react to form water vapor within the furnace itself. No torch is necessary in this embodiment. The reactor dimensions are similar to those employed in conventional furnaces as described above. As shown in FIG. 3, a furnace 301 includes many of the same components identified in the furnace of FIG. 1. Those components are indicated by like reference numbers in FIGS. 1 and 3.

As shown, reactor 301 includes a flowing gaseous hydrogen stream inlet 303 and a flowing gaseous oxygen stream inlet 305 at the bottom of furnace housing 31. A properly diluted hydrogen mixture is provided to inlet 303 from a source of diluted hydrogen 307. Molecular oxygen is provided to inlet 305 by an oxygen source 309. The inlets are arranged with respect to furnace housing 31 so that the gaseous hydrogen and oxygen streams entering reactor 301 pass into a hollow vertical injector tube 311. As shown, tube 311 is preferably disposed within the interior of reactor 301. Thus, the temperature of tube 311 will be about the same temperature as the remainder of the furnace; i.e., typically at least about 700 degrees Centigrade.

In tube 301, the hydrogen and oxygen react without producing a flame to produce water vapor which subsequently reacts with exposed reactive surfaces of wafers 35 to produced the desired oxygen containing layers. To facilitate reaction of hydrogen and oxygen in injector tube 311, the tube may be filled with a high surface area packing material 313 such as quartz, beads, or balls. This packing material is heated by heater 33 to provide the activation energy necessary to drive the reaction of hydrogen and oxygen. The size of the packing material should be chosen so that there is not an excessive pressure drop within column 311. In addition, the packing material should remain fixed in position so as not to introduce particles into the furnace.

In a specific embodiment, the packing material includes rounded quartz objects (e.g., spheres) of about 2 to 3 mm diameter. Obviously, the size of the packing material will depend upon the diameter of column 311 as well as the flow rate of the gaseous hydrogen and oxygen streams entering reactor 301. The shape of the packing material can also be varied to provide for specific pressure drops and reaction conditions.

The oxide layers formed in accordance with this invention will typically be high quality oxides formed on semiconductor devices. Examples of the layers formed include gate oxides, field isolation oxides, trench isolation oxides, DRAM capacitor dielectrics, etc. Such oxides are usually high purity semiconductor oxides such as silicon oxides. They may be formed as sublayers of in dielectric stacks such as stacked gate dielectrics including one or more layers of each of silicon oxide, silicon nitride, and/or silicon oxynitride. It is also possible, that the oxide layer will a non-semiconductor oxide such as a metal oxide.

The thicknesses of oxide layers produced in accordance with the present invention may be between about 10 and 500 angstroms, depending on the application. The thickness can be easily controlled by limiting the time that the semiconductor wafer is exposed to the water vapor, by controlling the reaction temperature, by controlling the partial pressure of the reacting water vapor, etc. The oxidizing rate is directly proportional to the partial pressure of the oxidizing species (i.e., water). For very thin gate dielectrics or sublayers, very low concentrations of hydrogen in diluent may be employed (e.g., less than about 1% by volume). Generally, gate dielectrics (or gate dielectric sublayers in a stack) and capacitor dielectrics are quite thin—on the order of about 10 to 15 angstroms thick. Generally, field isolation oxides are substantially thicker—on the order of about 200 to 5,000 angstroms.

While this invention has been described in terms of several preferred embodiments, it is contemplated that alternatives, modifications, permutations and equivalents thereof will become apparent to those skilled in the art upon a reading of the specification and study of the drawings. It is therefore intended that the following appended claims include all such alternatives, modifications, permutations and equivalents as fall within the true spirit and scope of the present invention.

What is claimed is:

1. A method of forming an oxygen containing layer on a semiconductor surface, the method comprising:

(a) forming water vapor, at pressures of between about 200 and 800 Torr, by reacting gaseous hydrogen and gaseous oxygen without generating a flame; and (b) contacting the water vapor with the semiconductor surface under conditions which form the oxygen containing layer on the semiconductor surface.

2. The method of claim 1, wherein the gaseous hydrogen and gaseous oxygen each have a purity of at least about 99.999% by volume.

3. The method of claim 1, wherein the gaseous hydrogen is provided as a mixture of molecular hydrogen and an inert diluent.

4. The method of claim 3, wherein the molecular hydrogen is present in the mixture at a concentration of at most about 10% by volume.

5. The method of claim 3, wherein the diluent is molecular nitrogen or a noble gas.

6. The method of claim 5, wherein the diluent is argon.

7. The method of claim 1, further comprising forming a reaction mixture of gaseous hydrogen and gaseous oxygen in a ratio of molecular hydrogen to molecular oxygen that is at least about 4:6 by volume.

8. The method of claim 1, further comprising transporting the water vapor from a first reactor where it is formed to a second reactor where it contacts the semiconductor substrate.

9. The method of claim 1, wherein the water vapor is formed and reacted with the semiconductor surface in a single reactor.

10. The method of claim 9, wherein the single reactor includes an injection column packed with a heated packing material which provide activation energy for the reaction of hydrogen and oxygen.

11. The method of claim 1, wherein the oxygen containing layer is a silicon oxide layer.

12. The method of claim 1, wherein the oxygen containing layer is a nitrogen containing silicon oxide layer.

13. The method of claim 1, wherein a pressure of at most about atmospheric pressure is used to form water vapor.

14. The method of claim 1, wherein a temperature of between about 700 and 1000 degrees Centigrade is used to form water vapor.

15. The method of claim 1, wherein a temperature of at most about 700 degrees Centigrade is used to form water vapor.

* * * * *